United States Patent [19]
Logan, Jr.

[11] Patent Number: 5,710,651
[45] Date of Patent: *Jan. 20, 1998

[54] REMOTE MILLIMETER-WAVE ANTENNA FIBER OPTIC COMMUNICATION SYSTEM USING DUAL OPTICAL SIGNAL WITH MILLIMETER-WAVE BEAT FREQUENCY

[75] Inventor: Ronald T. Logan, Jr., Newtown, Pa.

[73] Assignee: California Institute of Technology, Pasadena, Calif.

[*] Notice: The term of this patent shall not extend beyond the expiration date of Pat. No. 5,379,309.

[21] Appl. No.: 571,368

[22] Filed: Dec. 13, 1995

[51] Int. Cl.⁶ .................. H04B 10/12; H04B 10/142
[52] U.S. Cl. .................. 359/145; 359/168; 359/173; 359/188
[58] Field of Search .................. 359/145, 146, 359/168, 173, 180, 188, 191, 192, 193

[56] References Cited

U.S. PATENT DOCUMENTS

| | | | |
|---|---|---|---|
| 4,635,246 | 1/1987 | Taylor et al. | 372/18 |
| 4,918,747 | 4/1990 | Bekooji | 359/161 |
| 5,107,358 | 4/1992 | Hodgkinson et al. | 359/173 |
| 5,214,422 | 5/1993 | Cullimore | 359/146 |
| 5,251,053 | 10/1993 | Heidemann | 359/146 |
| 5,379,309 | 1/1995 | Logan, Jr. | 372/18 |
| 5,408,350 | 4/1995 | Perrier et al. | 359/168 |

Primary Examiner—Leslie Pascal
Attorney, Agent, or Firm—Michaelson & Wallace

[57] ABSTRACT

The transmitter or receiver of the remote antenna system of the present invention includes a fiber optic link connecting the receiver or transmitter station with a remote antenna station. The optical carrier for the fiber optic link is produced by a dual optical signal generator, preferably in the form of two narrow-linewidth lasers frequency offset by a difference frequency corresponding to the millimeter-wave or microwave signal. If the invention is employed to convey a baseband signal from the transmitter station to the antenna station, a modulator at the transmitter station modulates the dual optical signal carrier with the baseband signal. The modulated signal is carried over the optical fiber to a photodetector at the remote antenna station which detects the millimeter wave difference frequency modulated by the baseband signal. If the invention is employed to convey a received millimeter wave signal from the remote antenna station to the receiver station, then a modulator at the remote antenna station modulates the dual optical signal carrier with the received millimeter wave signal. The modulated signal is carried over the optical fiber to a photodiode at the receiver station which detects the baseband contained in the millimeter wave signal.

35 Claims, 7 Drawing Sheets

REMOTE MILLIMETER-WAVE ANTENNA FIBER OPTIC COMMUNICATION SYSTEM USING DUAL OPTICAL SIGNAL WITH MILLIMETER-WAVE BEAT FREQUENCY

BACKGROUND OF THE INVENTION

1. Origin of the Invention

The invention described herein was made in the performance of work under a NASA contract, and is subject to the provisions of Public Law 96-517 (35 USC 202) in which the contractor has elected to retain title.

2. Field of the Invention

The present invention relates in general to microwave and millimeter-wave signal processing and transmission, and in particular, to remote optical coupling between a millimeter-wave or microwave transmitter or receiver and its antenna.

3. Related Art

Telecommunications systems utilizing carrier signals with high frequencies include microwave and millimeter-wave systems, as well as fiber optic link systems. These high frequency systems are desirable because information capacity is proportional to frequency. Frequencies below 1 Giga-Hertz (GHz) are considered radio frequencies (RF), frequencies from 1 GHz to 30 GHz are considered microwaves, and frequencies from 30 GHz to 300 GHz are considered millimeter-waves. Fiber optic links, which make use of light waves, have carrier wavelengths with frequencies around $10^{14}$ Hz.

Microwaves and millimeter-waves, travel, or propagate, through space and thus, must be directed or guided by an antenna. The antenna contains components such as microwave waveguides or millimeter-wave stripline circuitry. A receiving antenna, receives microwave or millimeter-wave radiation, and directs the radiation to appropriate instruments for further processing. The transmitting antenna works in reverse fashion.

Microwave and millimeter-wave frequencies, in the form of electronic signals, must be transmitted in rigid waveguide or stripline structures, which are difficult to handle, costly, bulky, and heavy. Also, frequency conversion of modulation signals to and from a millimeter-wave carrier must be done in several discrete stages, due to the bandwidth limitations of electronic mixers. This complicates the construction of a millimeter-wave transmitter or receiver.

Further, it is impractical to transmit millimeter-wave signals for long distances on metallic waveguides. Consequently, in conventional systems, upconversion and downconversion is performed in close proximity to the radiating aperture, and a lower-frequency intermediate frequency(IF) is transported on coaxial cables to and from the antenna site. As a result, a stable multiplier chain must be located in close proximity to the antenna aperture, and supplied with a stable frequency reference. Thus, although there are many advantages of using millimeter-wave frequencies, this type of system architecture is fundamentally incompatible with the harsh environments that antennas must endure.

Consequently, the construction and placement of microwave and millimeter-wave transmitters and receivers is a complicated and expensive process. Expensive, bulky, and thermally controlled enclosures, must be located in the harsh environments since the radiating antenna must produce stable phase performance.

Therefore, what is needed is a simpler system for communication between a microwave or millimeter-wave transmitter or receiver and the antenna. What is also needed is a system that reduces equipment required in a hostile environment. What is also needed is a system reducing expensive environmental controls. What is further needed is a practical system having smaller antennas forming an array of antennas.

With regard to fiber optic systems, fiber optic transmission technology is being increasingly used in the telecommunications field. However, the bandwidth of these systems is limited by the modulation speed of the lasers used. In addition, these system are limited because they operate at frequencies below 20 GHz on the electromagnetic spectrum. Since the bandwidth is limited by the modulation speed of the laser, there is a fundamental problem in generating modulation of an optical carrier at sufficiently high frequencies to take advantage potential large optical bandwidths.

Whatever the merits of the above mentioned existing systems and methods, they do not achieve the benefits of the present invention.

SUMMARY OF THE INVENTION

To overcome the limitations in the prior art described above, and to overcome other limitations that will become apparent upon reading and understanding the present specification, the present invention is a microwave and millimeter-wave receiving and transmission system. The present invention includes a millimeter-wave or microwave transmitter or receiver station optically coupled to a remote antenna station by fiber optic links. The fiber optic link carries microwave or millimeter-wave signals on an optical carrier between the transmitter or receiver and the remote antenna.

The transmitter or receiver of the remote antenna system of the present invention includes a fiber optic link connecting the receiver or transmitter station with a remote antenna station. The optical carrier for the fiber optic link is produced by a dual optical signal generator, preferably in the form of two narrow-linewidth lasers frequency offset from each other. The outputs of the lasers are combined to produce a difference frequency corresponding to the millimeter-wave or microwave signal.

If the invention is employed to convey a baseband signal from the transmitter station to the antenna station, a modulator at the transmitter station modulates the dual optical signal carrier with the baseband signal. The modulated signal is carried over the optical fiber to a photodetector at the remote antenna station which detects the millimeter wave difference frequency modulated by the baseband signal. In this case, the frequency response of the input to the modulator need only be adequate to handle the baseband signal while the photodetector must have a frequency response adequate to detect the millimeter wave difference frequency.

If the invention is employed to convey a received millimeter wave signal from the remote antenna station to the receiver station, then a modulator at the remote antenna station modulates the dual optical signal carrier with the received millimeter wave signal. The modulated signal is carried over the optical fiber to a photodiode at the receiver station which detects the baseband contained in the millimeter wave signal. In this case, the modulator must have a frequency response adequate to handle the millimeter wave signal received from the antenna while the photodetector need respond only to the baseband frequency contained in the millimeter wave signal.

Low phase noise of the microwave or millimeter-wave signal can be achieved by establishing phase coherence between the two lasers by frequency offset phase locking the lasers using a stable electronic reference signal in accordance with a technique disclosed in U.S. Pat. No. 5,379,309 issued on Jan. 3, 1995 to Logan, Jr, the inventor herein.

An advantage of the present invention is that expensive upconvertors and downconvertors may be remote from the antenna site. Another advantage of the present invention is that less equipment is required in a hostile environment. Another advantage of the present invention is that the use of expensive environmental control equipment is limited.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The invention may be employed in optically modulating a baseband signal at a transmitter station and conveying it over a fiber optic link to a remote antenna station for upconverting to a millimeter-wave or microwave signal for transmission from the antenna. The invention may also be employed in optically modulating a received millimeter-wave or microwave signal at a remote antenna station and conveying it over the fiber optic link to a receiver station where it is downconverted to a baseband signal.

Upconversion

Figure 1:
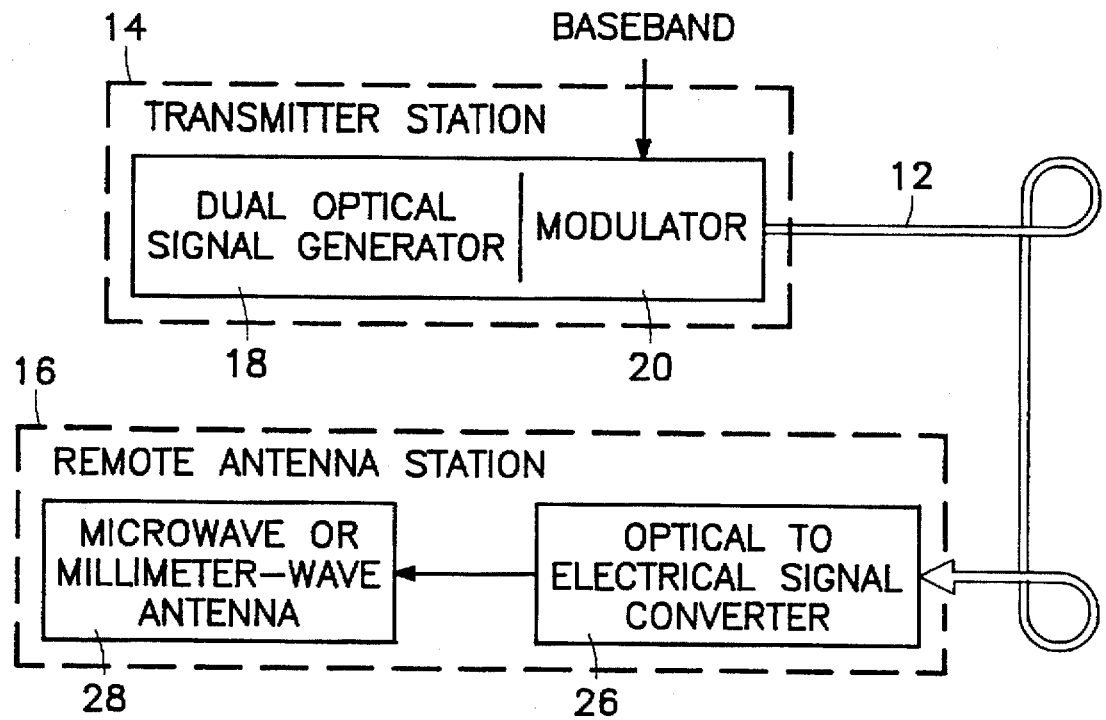
FIG. 1 is a block diagram of a an upconversion system of the present invention.

FIG. 1 illustrates an overall block diagram of the upconversion system of the invention. A fiber optic link 12 carries microwave or millimeter-wave signals on an optical carrier between a microwave or millimeter-wave transmitter or receiver station 14 and a remote microwave or millimeter-wave antenna 16. The transmitter or receiver station 14 includes a dual optical signal generator 18, such as a laser heterodyne system, for generating a millimeter-wave beat frequency signal. The dual optical signal generator 18 combines a first laser with a second laser and is coupled to a modulator 20.

For upconversion of the millimeter-wave beat frequency signal to an optical signal, an electro-optical modulator 20 modulates either an individual one of the two dual optical signal or (alternatively) modulates a combination of the two dual optical signals. In the former case the modulator 20 may be either an intensity modulator or a phase modulator while in the latter case the modulator 20 is preferably an intensity modulator. A baseband signal (i.e., one containing information or data) is applied to a control input of the modulator 20.

The remote antenna station 16 includes an optical to electrical signal convertor 26 for converting the optical signal received through the fiber optic link 12 to an electrical signal. The generated electrical signal is then sent to microwave or millimeter-wave antennas 28.

Figure 2A:
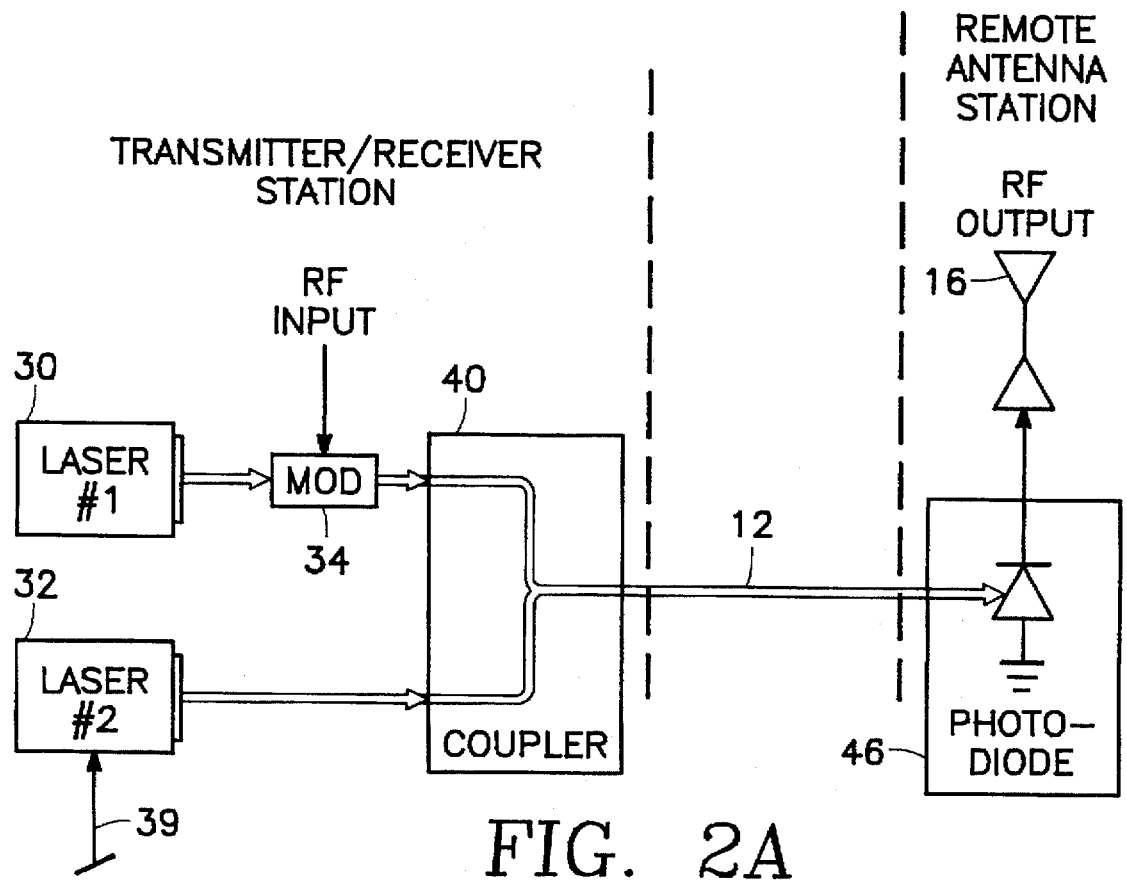
FIG. 2A is a block diagram of a first embodiment of the upconversion system of the present invention in which only one of the two dual optical signals is directly modulated with a baseband signal.

FIG. 2A illustrates a first embodiment of the upconversion system of the invention. The modulation bandwidth of the dual optical signal produced by dual optical generator 18 of FIG. 1 is between DC and in excess of 100 GHz. A first laser 30 and second laser 32, which can be narrow-linewidth standard continuous wave semiconductor laser diodes are frequency offset by a millimeter-wave or microwave difference frequency $f_{LO}$ to provide a narrow band millimeter-wave or microwave signal. In the description that follows, the invention is implemented using semiconductor lasers. However, it should be understood that the invention is not limited to any particular implementation, as other types of lasers may be employed, particularly in implementing the continuous wave lasers. The millimeter or submillimeter wave source of the invention can be implemented in a single hybrid package or on a single integrated circuit, particularly if semiconductor lasers are employed.

Figure 2B:
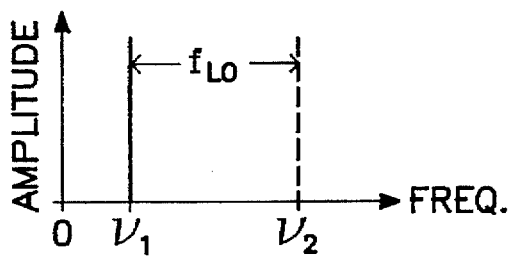
FIGS. 2B, 2C, 2D, 2E, 2F, 2G and 2H depict the frequency spectrum present at various locations in the system of FIG. 2A.
Figure 2C:
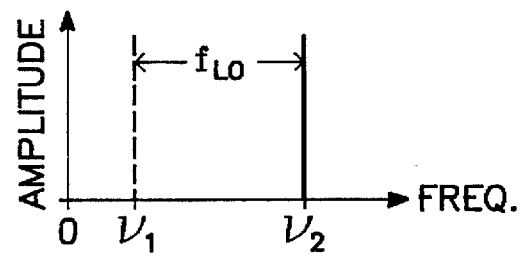

The first laser 30 and second 32 laser preferably are of equal amplitude. The first laser 30 is a fixed-frequency device, and the second laser 32 is a variable frequency device, which, for example, could be tuned 39 from 0 to ±40 GHz in a conventional manner by a temperature and/or piezoelectric tuner. The optical spectrum of each of the lasers is depicted in the graphs of FIGS. 2B and 2C, respectively.

The lasers 30 and 32 are combined by coupling the lasers 30 and 32 through optical fiber to a fiber optic coupler 40. The polarization states of the lasers 30 and 32 preferably are co-linear with each other prior to entering the coupler 40.

Figure 2D:
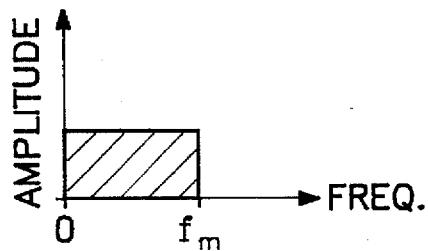
Figure 2E:
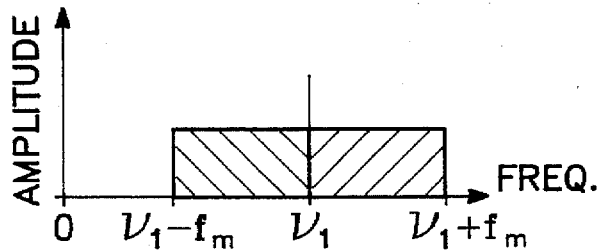
Figure 2F:
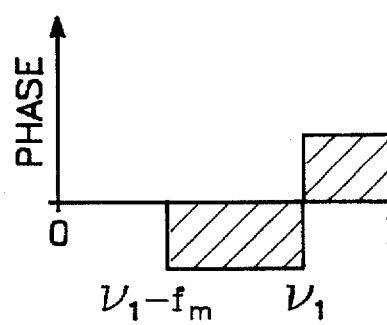

The output signal from the first laser 30 is modulated by a modulator 34, which may be either an electro-optical intensity modulator or an electro-optical phase modulator, prior to entering the coupler 40, in accordance with an electrical baseband input signal applied to a control input of the modulator 34. The spectrum of the baseband signal is depicted in the graph of FIG. 2D. The optical spectrum of the output of the modulator 34 is depicted in the graph of FIG. 2E for the case in which the modulator 34 is an intensity modulator and in FIG. 2F for the case in which the modulator 34 is a phase modulator. The optical spectrum of the output of the coupler 40 is depicted in the graph of FIG. 2G for the case of intensity modulation in accordance with FIG. 2E.

The modulated dual optical signal is transmitted from the output of the coupler 40 over the optical link 12, which may be a single mode optical fiber for a finite distance such as twelve kilometers, to a photodetector 46. The photodetector 46 has a frequency response (e.g., 40 GHz) sufficient to detect the millimeter-wave (or microwave) difference beat frequency contained in the dual optical signal to convert it to an electrical millimeter-wave carrier signal whose spectrum is illustrated in FIG. 2H. This electrical signal produced by the photodiode 46 is typically filtered, amplified and sent to the microwave or millimeter-wave antenna 16.

Figure 2G:
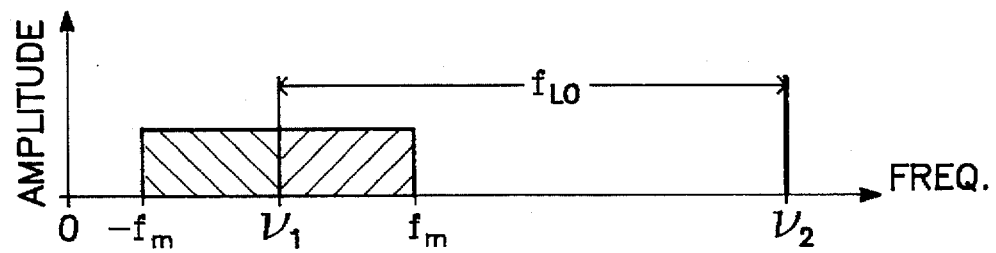
Figure 2H:
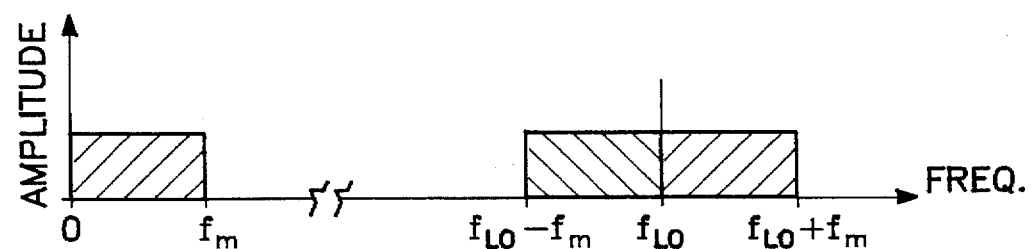

The detection performed by the photodiode 46 completes a heterodyne process in which the frequency spectrum in the optical fiber 12 depicted in FIG. 2G (containing the two optical frequencies of the lasers 30, 32, the millimeter or microwave difference frequency $f_{LO}$ and the baseband frequency $f_M$) is converted to the frequency spectrum at the antenna depicted in FIG. 2H (containing only the difference frequency $f_{LO}$ and the baseband frequency $f_M$). This heterodyning process electronically mixes together the different optical frequencies of the two lasers 30 and 32 to detect the millimeter or microwave difference frequency $f_{LO}$. The baseband signal applied to the modulator 34 is detected as a modulation carried on the difference frequency $f_{LO}$ because a change in either amplitude or phase of the first laser 30 produces a corresponding change in amplitude of the detected millimeter-wave or microwave signal at $f_{LO}$. Thus, the baseband signal is up-converted in one step, a significant advantage. This one step upconversion eliminates the need for multistage upconversion and also eliminates the need for rigid waveguides to transmit millimeter-wave beat signals.

The system of FIG. 2A can, for example, upconvert baseband signals with frequencies of approximately 50 MHz to sidebands of microwave signals with frequencies of approximately 26 GHz. The difference frequency $f_{LO}$ should lie in the range from 0 Hz to 40 GHz, the upper end of this range being limited by the thermal tuning range of the second laser. Without such a limitation, the offset frequency can be as high as 1000 GHz. Presently, the second laser 32 can be frequency tuned from 0 to 40 GHz by conventional means such as temperature and/or a piezo electric device. A frequency-locking loop of the type well-known in the art not illustrated in FIG. 2A may be required to hold the difference frequency.

Figure 3A:
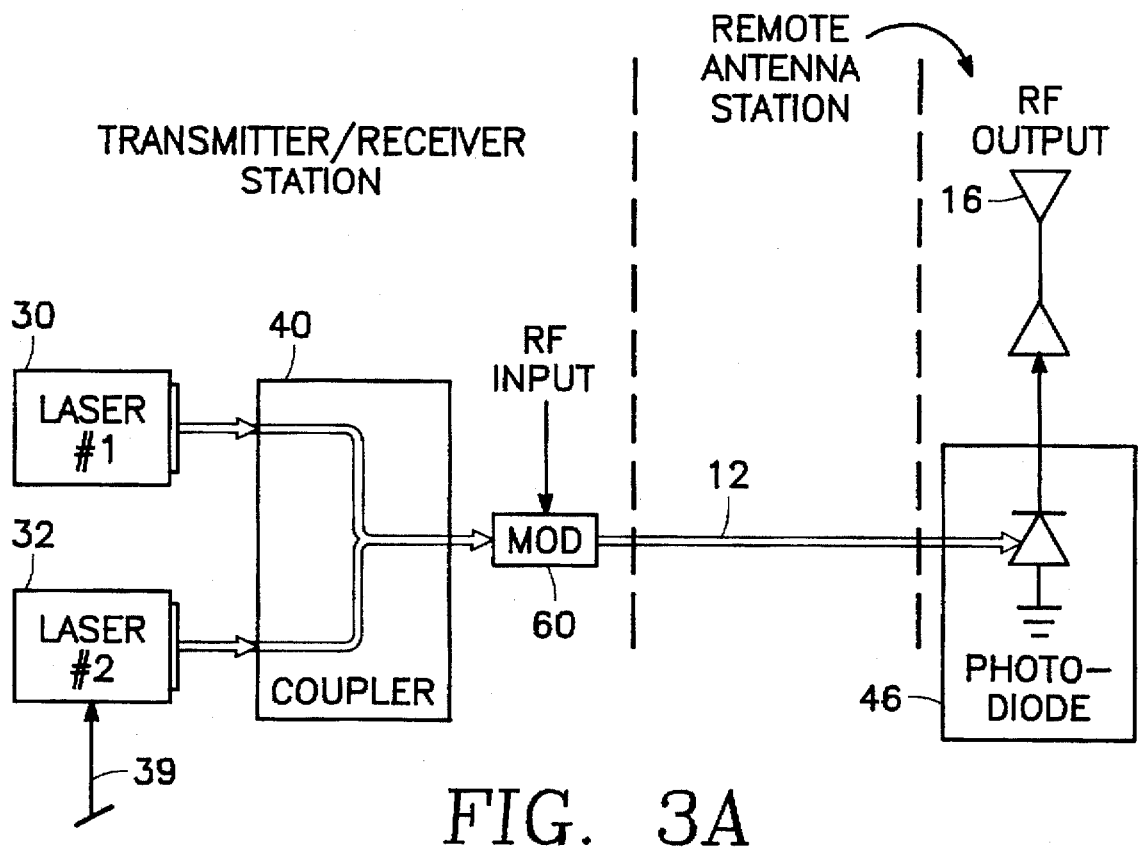
FIG. 3A is a block diagram of a second embodiment of the upconversion system of the present invention in which a combination the two dual optical signals is modulated with a baseband signal.
Figure 3B:
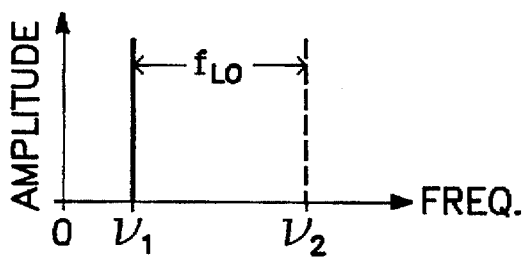
FIGS. 3B, 3C, 3D and 3E depict the frequency spectrum present at various locations in the system of FIG. 3A.
Figure 3C:
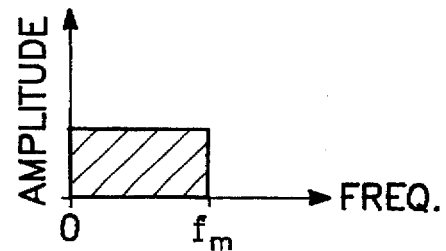
Figure 3D:
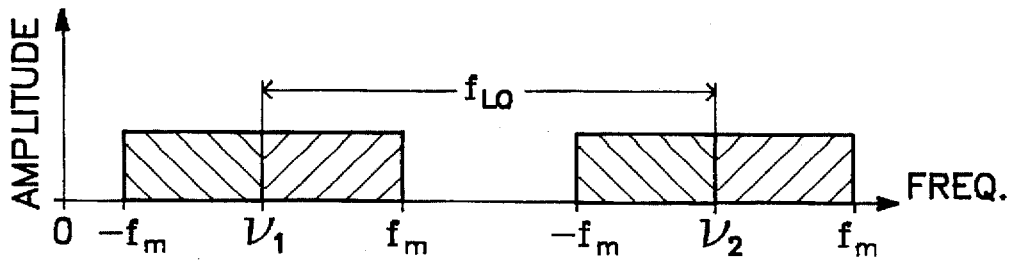
Figure 3E:
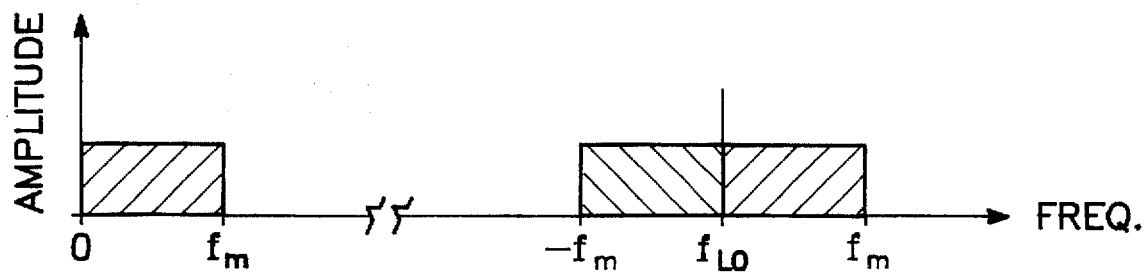

FIG. 3A illustrates a second embodiment of the upconversion system of the invention. In the embodiment of FIG. 3A, the coupler 40 combines the two dual optical signals prior to any modulation with the baseband signal. The optical spectrum of at the output of the coupler 40 is illustrated in FIG. 3B. An electro-optical intensity amplitude modulator 60 is coupled to the output of the fiber optic coupler 40 rather than to the output of an individual one of the lasers 30, 32. The baseband signal whose spectrum is illustrated in FIG. 3C is applied to an electrical (modulating) input of the electro-optical intensity modulator 60 while the output from the coupler 40 is applied to the optical input of the electro-optical intensity modulator 60. The baseband signal is impressed on the dual optical signal from the coupler 40. The modulating input of the modulator 60 need respond only at the baseband frequency. The output signal from the electro-optical intensity modulator 60 is transmitted over the optical fiber 12 to the remote antenna station and is detected there by the photodetector 46. The optical spectrum in the optical fiber 12 is illustrated in FIG. 3D and contains the optical frequencies of the two dual optical signals separated by the difference frequency $f_{LO}$ with sideband frequencies $\pm f_M$. The detection performed by the photodetector 46 completes a heterodyne process in producing an electrical output signal whose spectrum (illustrated in FIG. 3E) contains the difference frequency $f_{LO}$ as a carrier with sidebands at $\pm f_M$.

In the system of FIG. 3A, the baseband input signal to the modulator 60 at angular frequency $\omega_M$, will generate photocurrent upon detection at angular $\omega_M$ as well as at the difference frequencies $\Delta\omega \pm \omega_M$, wherein $\Delta\omega$ is the angular difference frequency corresponding to the difference frequency $f_{LO}$ between the lasers 30 and 32. Thus, power in upper and lower sidebands at $\Delta\omega \pm \omega_m$ is:

$$P(\Delta\omega \pm \omega_m) = \frac{I_1 I_2}{(I_1 + I_2)^2} P(\omega_m)$$

where, $I_1$, and $I_2$, represent the DC photocurrents from each respective separate laser. Also:

$$P(\omega_m) = \frac{1}{2} m^2 (I_1 + I_2)^2 R_L$$

wherein $P(\omega_m)$, the detected microwave power, is produced by the modulation of index m at frequency $\omega_m$ and $R_L$ is a load resistance.

However, for equal power lasers, where $I_1 = I_2$, the sideband amplitude is:

$$P(\Delta\omega \pm \omega_m) = \frac{I^2}{(2I)^2} P(\omega_m)$$

$$P(\Delta\omega \pm \omega_m) = \frac{1}{4} P(\omega_m)$$

Consequently, transmission of the signal through the photonic mixing process produces minimal conversion losses of approximately −6 dB, as compared to the direct transmission of the microwave signal through the fiber optic link.

Lithium-niobate and GaAs electro-optical intensity modulators with bandwidths in excess of 50 GHz can also be used. Proper tuning of the modulator 60 response allows the wide bandwidth lithium-niobate and GaAs electro-optical intensity modulators to produce improved modulation efficiency in a narrow band at millimeter-wave frequencies. Thus, optical heterodyne generation coupled with a high-speed modulator provides simultaneous downconversion from millimeter-wave frequencies, and multi-kilometer transmission of the downconverted signal over optical fiber.

Heterodyne generation and processing of the millimeter-wave signals with the external optical modulators of the present invention generates modulation of an optical carrier at relatively high frequencies. In addition, low phase noise of the millimeter-wave signal is achieved by establishing phase coherence between the two lasers by offset phase locking the lasers using a stable electronic reference signal.

Figure 4:
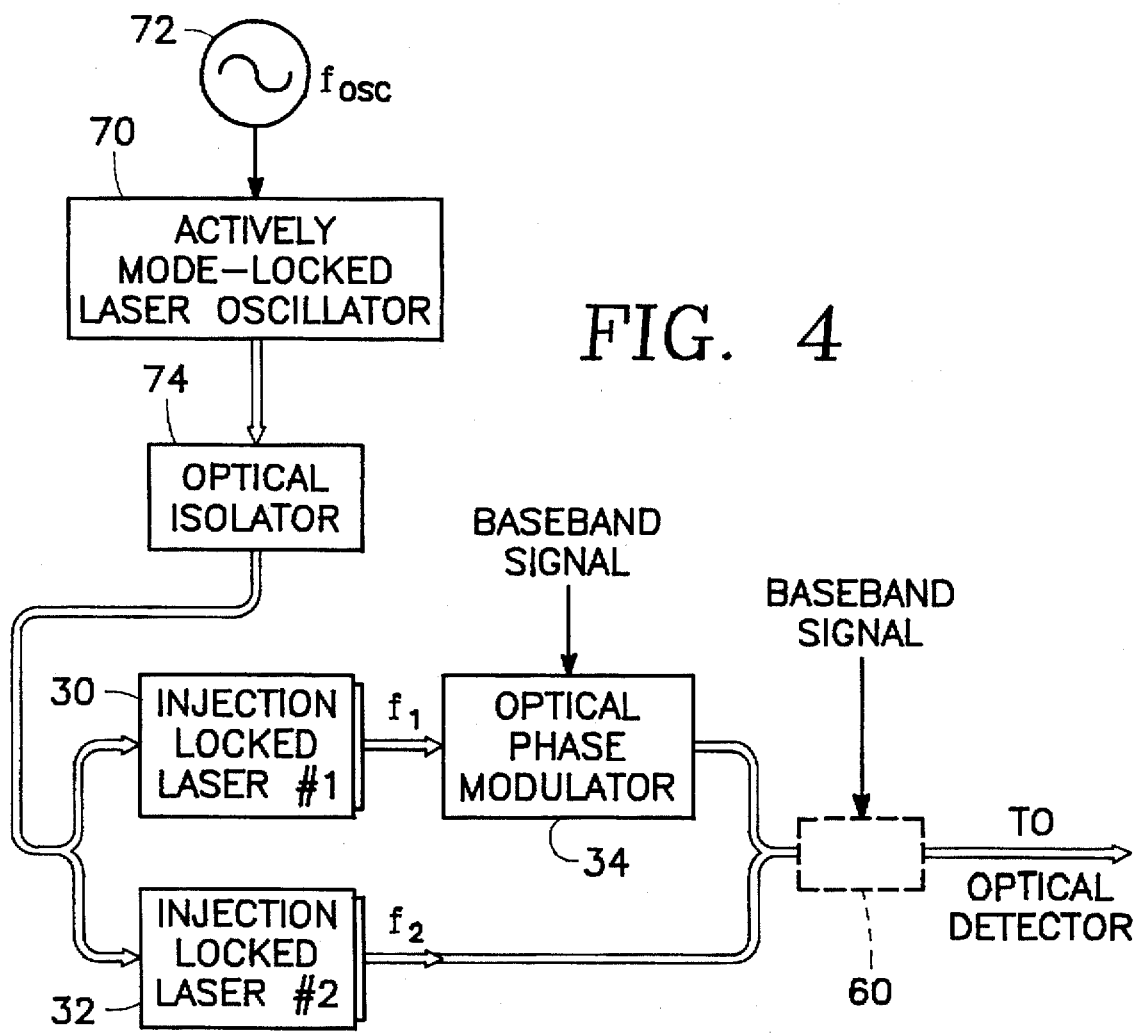
FIG. 4 is a block diagram illustrating how injection locked lasers controlled by a common mode-locked laser can be employed as the dual optical source in the various embodiments of the present invention.

FIG. 4 illustrates an embodiment employing a mode-locked system disclosed in U.S. Pat. No. 5,379,309. This embodiment achieves a high-degree of correlation between the phase fluctuations of the two independent single-frequency lasers 30 and 32, operating at slightly different optical frequencies. The frequency difference of the lasers 30 and 32 is set equal to the desired millimeter-wave frequency, as described previously. The phase fluctuations of the lasers 30 and 32 are forced to be correlated by injection-locking them with separate longitudinal modes of a third multimode laser 70. The multimode laser 70 is forced to have a high degree of phase coherence between its longitudinal modes by the well-known process of "active mode-locking" via modulation with a low-frequency reference signal 72. The phases of the two injection-locked lasers 30,32 will thus be highly correlated, and the detected millimeter-wave optical intensity modulation will not only have low phase noise, but will also be phase-coherent with the low-frequency reference signal.

Beginning at the left of the diagram of FIG. 4, the electronic reference frequency oscillator 72 drives the actively mode-locked laser 70 at a frequency $f_{osc}$ coincident with the longitudinal mode separation of the mode-locked laser cavity. The frequency $f_{osc}$ must be harmonically related to the desired millimeter-wave output frequency. When the laser 70 is mode-locked, all of the longitudinal modes have a well-defined phase relationship that is time-invariant. The optical spectrum thus resembles a "comb" of frequencies, separated by the driving frequency $f_{osc}$. If N longitudinal modes are locked, the detected intensity of this signal would appear as a stream of pulses at a repetition rate of $f_{osc}$, with pulse widths of approximately $q/(Nf_{osc})$, where q is a measure of the bandwidth of the laser. The output of the mode-locked laser 70 is passed through an optical isolator 74 to prevent reflected power from destabilizing its output, and then split before being coupled into the continuous-wave lasers #1 and #2 (30 and 32, respectively).

The single-frequency lasers #1 and #2 are injection locked to different longitudinal optical modes of the actively mode-locked laser 70, via frequency-selective tuning elements in their respective cavities. Thus, lasers #1 and #2 each select and amplify only one mode of the multimode output spectrum generated by the actively mode-locked laser 70. Finally, the outputs of the injection-locked lasers #1 and #2 are combined to yield a heterodyne signal. The detected intensity of this signal contains DC term plus a time-varying term at the frequency difference of lasers #1 and #2. This frequency difference can be varied by the user from a minimum of $f_{osc}$ to a maximum of $N*f_{osc}$, where N is the number of locked modes. Due to the extremely wide optical bandwidths of laser gain media, it is not uncommon for mode-locked lasers to have hundreds of locked modes spanning more than 1000 GHz. Therefore it is possible to generate intensity modulation signals over this wide range of frequencies using this technique. More importantly, the generated signals will have low phase noise compared to existing techniques of signal generation at these frequencies. The millimeter-wave intensity-modulated optical signals can be detected by a fast photodiode to convert them to electrical signals.

The millimeter-wave signal is modulated by a baseband information signal. This can be done in accordance with the embodiments of either FIGS. 2 or 3. For example, if the modulation is performed in accordance with the embodiment of FIG. 2, then the electro-optical phase modulator 34 linearly modulates the phase of the output signal from laser #1 in accordance with the baseband signal prior to combination with laser #2. This is a simple means of up-converting the baseband signal containing information in analog or digital form to an intensity-modulation centered at the millimeter-wave carrier frequency. This aspect of modulation is useful for millimeter-wave subcarrier multiplexing.

Several difference frequencies, each with a unique baseband modulation, could be generated using this scheme, by adding additional injection-locked lasers. A complex subcarrier multiplexed modulation signal can thus be generated in this way.

Downconversion

Figure 5A:
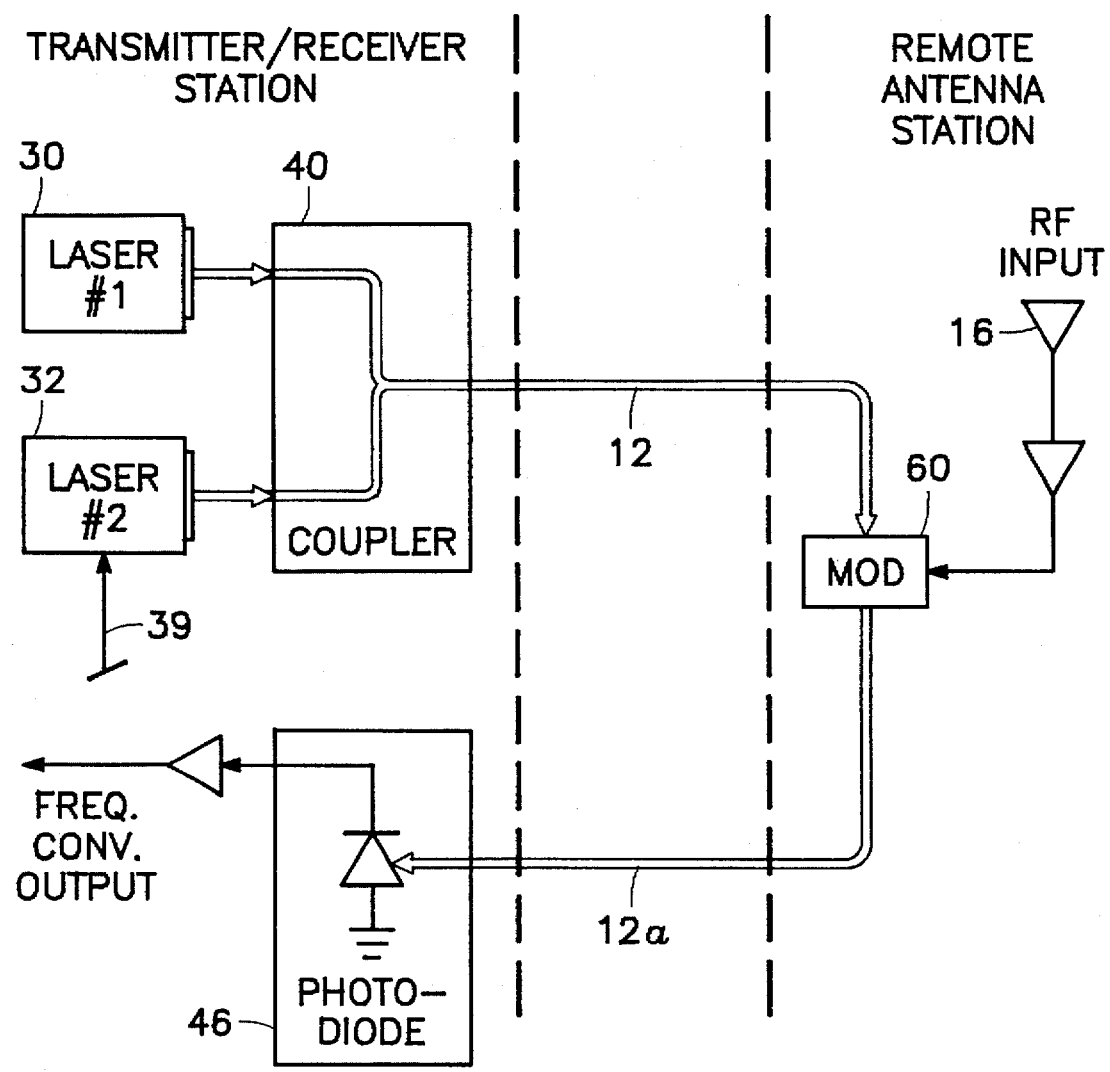
FIG. 5A is a block diagram of a first embodiment of the downconversion system of the present invention in which a combination the two dual optical signals is modulated with a received millimeter wave or microwave carrier containing a baseband signal.
Figure 5B:
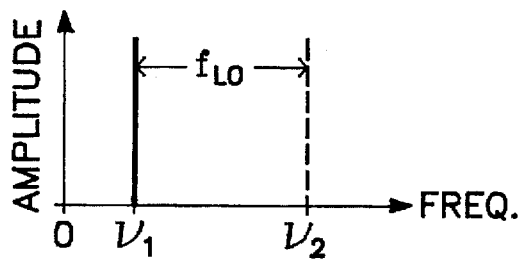
FIGS. 5B, 5C, 5D and 5E depict the frequency spectrum present at various locations in the system of FIG. 5A.
Figure 5C:
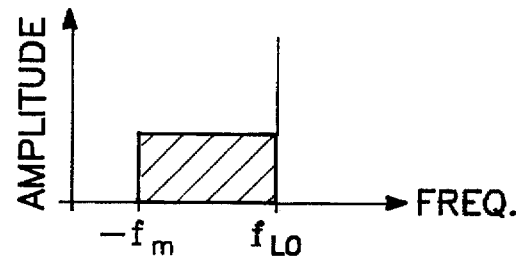
Figure 5D:
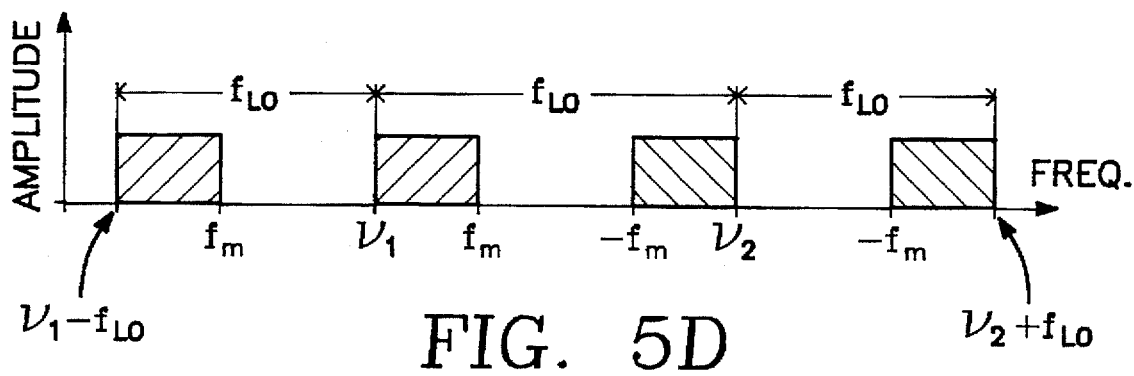
Figure 5E:
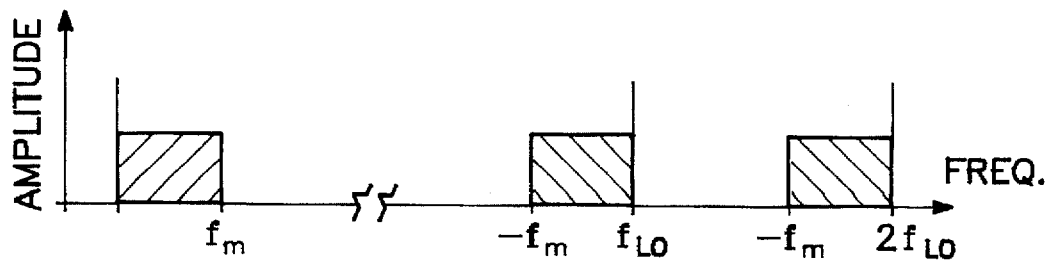

FIG. 5A illustrates a first embodiment of the downconversion system of the invention. The structure of the embodiment of FIG. 5A is analogous to that of FIG. 3A except as follows. First, the control input of the modulator 60 is coupled to a received millimeter-wave (or microwave) signal from the antenna (rather than a baseband signal to be transmitted). Second, the modulator 60 is located at the remote antenna station and is connected to the coupler 40 via the long optical fiber 12. Third, the photodetector 46 is located at the receiver station rather than the remote transmitter station and is connected to the output of the modulator 60 via a second long optical fiber 12a. However, the function of the embodiment of FIG. 5A is rather distinct from that of FIG. 3A. The frequency spectrum of the fiber optic link 12 (illustrated in FIG. 5B) contains only the optical frequencies of the two lasers 30, 32 and their difference frequency $f_{LO}$. The antenna provides a received millimeter-wave (or microwave) signal whose spectrum is illustrated in FIG. 5C containing a millimeter wave carrier frequency and a baseband frequency $f_M$ as a sideband at $f_{LO}$-$f_M$. Preferably, the difference frequency between the two lasers 30, 32 is equal to the millimeter wave carrier frequency $f_{LO}$ received by the antenna. The resulting modulated signal at the output of the modulator 60 has an optical spectrum illustrated in FIG. 5D containing four principal components, namely the two dual optical frequencies $v_1$ and $v_2$ and their harmonics at $\pm f_{LO}$, the two lowest components having sidebands at $+f_M$ and the two highest components with sidebands at $-f_M$. The RF spectrum available to the photodetector 46 is illustrated in FIG. 5E and contains the baseband frequency $f_M$ and harmonics of the difference frequency $f_{LO}$ each with a sideband at $-f_M$. The photodiode 46 in this embodiment is selected to have a cut-off frequency below the millimeter wave carrier $f_{LO}$ so that the electrical output signal from the photodiode 46 contains only the baseband signal.

Figure 6:
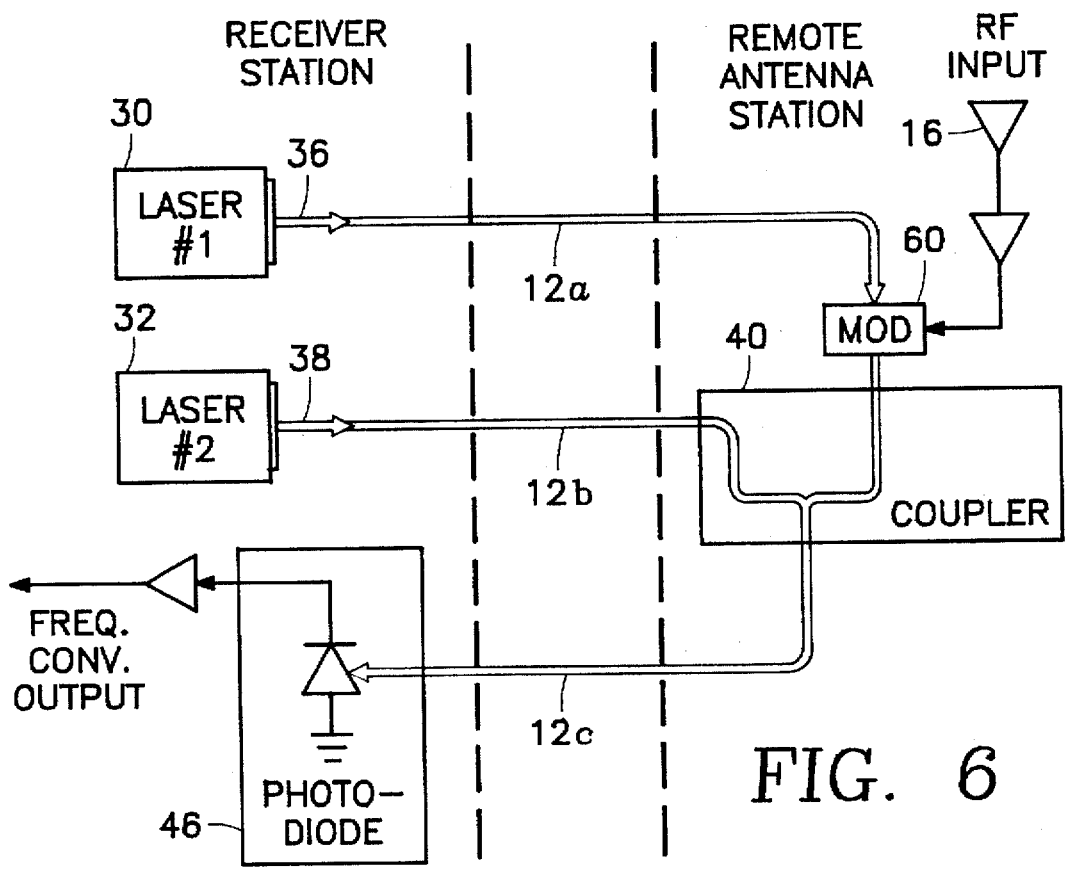
FIG. 6 is a block diagram of a second embodiment of the downconversion system of the present invention in which only one of the two dual optical signals is directly modulated with a received millimeter wave or microwave carrier containing a baseband signal.

FIG. 6 is a schematic diagram illustrating a second embodiment of the downconversion system of the invention in which the dual optical signal source 30, 32 is located at the receiver station and a structure analogous to that of FIG. 2A is employed in which only one of the two dual optical signals is modulated. In the embodiment of FIG. 6, three long optical fibers 12a, 12b, 12c comprise the optical link between the receiver station and the remote antenna station. The optical fibers 12a and 12b carry the two dual optical signals separately, one of them to the optical input of the modulator 34 and the other to one input of the coupler 40. The electrical input of the modulator 34 is connected to the antenna. The third long optical fiber 12c carries the output of the modulator 34 to the photodetector 46 at the receiver station. In this case, the modulator does not have to be an intensity modulator but can be a phase modulator if desired.

Figure 7:
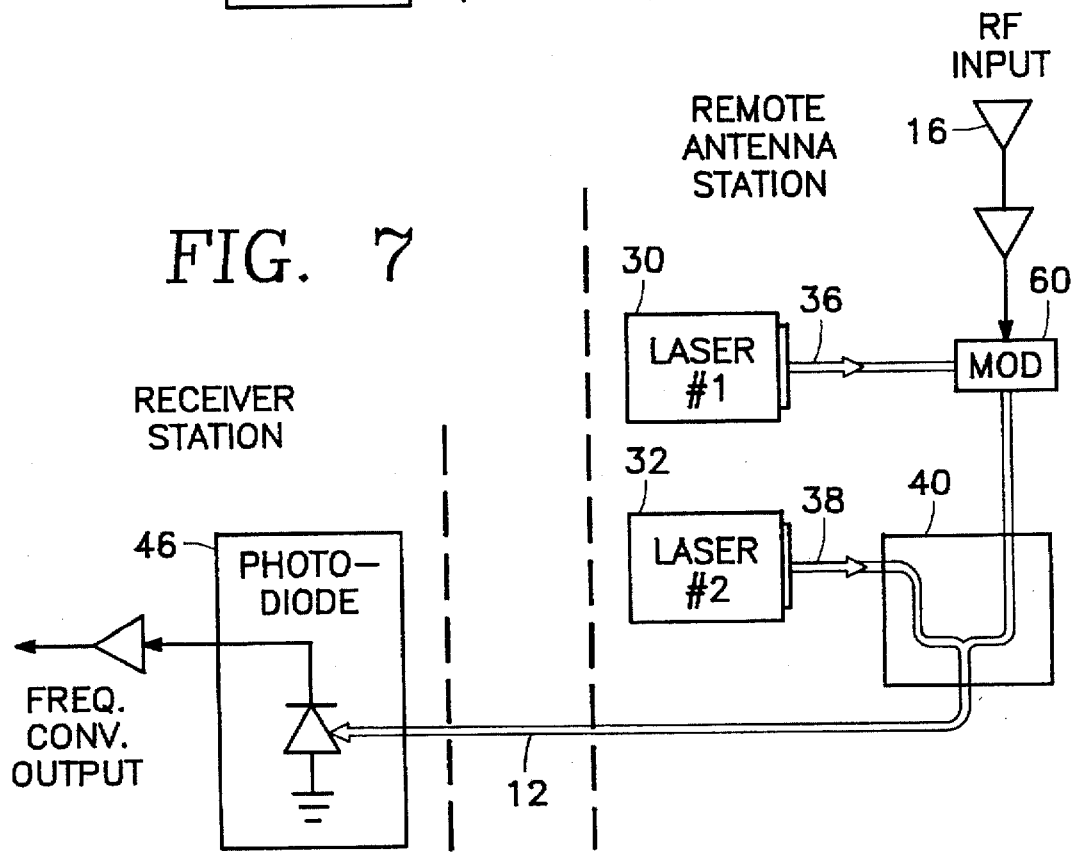
FIG. 7 is a block diagram of a third embodiment of the downconversion system of the present invention in which only one of the two dual optical signals is directly modulated with a received millimeter wave or microwave carrier containing a baseband signal and the dual optical signal source is located at the remote antenna station.

FIG. 7 illustrates a modification of the embodiment of FIG. 6 in which the dual optical signal source 30, 32 is located at the remote antenna source. Thus, only one long optical fiber is required, namely the optical fiber 12c connected between the coupler 40 and the photodiode 46.

Advantages of the Invention

The lasers 30 and 32 which can be employed in carrying out the invention generate optical carriers with extremely high frequencies, such as $10^{14}$ Hz. Consequently, the percentage bandwidth required for the transmission of a 100

GHz millimeter-wave signal is very small, or about 0.1%. Also, the single-mode optical fiber used in the present invention has very low dispersion, and yields a bandwidth-length product of over 1,000 GHz-km. In addition, the electro-optical components utilized, such as the optical coupler, amplifiers, switches, and attenuators, have similarly wide bandwidths. The above combinations allows signal transmission and processing functions of the present invention at microwave and millimeter-wave frequencies, especially from 20 GHz to 300 GHz.

The present invention also greatly improves isolation between signal ports, allows wider bandwidth operation, and has higher dynamic range than is presently available with electronic mixers. In addition, metallic waveguide and coaxial-cable related deficiencies such as high attenuation, cross-talk, and routing is greatly reduced or eliminated, since the signal path is entirely in optical fiber from the output of the low noise amplifier to the input of the receiver at the 300 MHz IF.

The present invention is also ideal for commercial applications, such as personal wireless telecommunication systems. The photonic system of the present invention enables easier access to regions of the electromagnetic spectrum in the microwave and millimeter-wave range than is currently practical. With the growing demand for personal wireless communications services, the electromagnetic spectrum is becoming increasingly crowded.

Also, since the present invention allows access to millimeter-wave frequencies, new wireless personal communications systems can be operated at high-frequencies and cellular antennas can be made very small because the small wavelengths of the millimeter-waves allow the antennas to be very small. In addition, the millimeter-waves are ideal for local-area wireless systems, where long-distance propagation is undesired, because of the natural absorption of certain millimeter-wave bands by the atmosphere.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A transmission system comprising:
   (A) a transmitter station comprising,
      (1) a dual optical signal generator producing a first optical signal and a second optical signal respectively, wherein said first optical signal is offset in frequency from said second optical signal by a difference frequency,
      (2) a coupler for combining said first and second optical signals to produce a combined output signal;
      (3) an external modulator for modulating, in accordance with a baseband signal, said combined output signal;
   (B) an optical fiber having one end coupled to said combined output signal; and
   (C) a remote antenna station comprising,
      (1) a photodetector coupled to another end of said optical fiber for converting said combined output signal to an electrical signal, and
      (2) an antenna coupled to said electrical signal.

2. The system of claim 1 wherein said modulator has a control input receiving said baseband signal, said control input of said baseband signal having a bandwidth corresponding to that of said baseband signal.

3. The system of claim 2 wherein said photodetector has a bandwidth corresponding to said difference frequency.

4. The system of claim 3 wherein said difference frequency is one of:
   (a) a microwave frequency;
   (b) a millimeter-wave frequency; and
   (c) a radio frequency.

5. The system of claim 1 wherein said optical fiber is single-mode optical fiber having low dispersion and yielding a relatively high bandwidth-length.

6. The system of claim 1 wherein said dual optical signal generator comprises first and second lasers each with co-linear polarization states for producing said first optical signal and said second optical signal, respectively.

7. The system of claim 6 wherein said transmitter station further comprises:
   a reference signal source having a frequency harmonically related to a desired output frequency;
   a reference laser having plural optical modes actively mode-locked to said reference signal source and having respective optical mode frequencies, whereby said reference laser is an actively mode-locked laser;
   wherein each of said first and second lasers is tuned to a respective one of said optical mode frequencies, whereby said first and second lasers are injection locked to corresponding ones of said plural optical modes of said mode-locked laser;
   wherein said difference frequency corresponds to a difference between two of said optical mode frequencies.

8. The system of claim 7 wherein said plural optical modes of said mode-locked laser span a frequency band at least hundreds of GigaHertz wide, and wherein said difference frequency is in a band encompassing millimeter and submillimeter wavelengths.

9. The system of claim 1 wherein said modulator modulates said first optical signal before an input of said first optical signal to said coupler, said modulator comprising one of:
   (a) an electro-optical intensity modulator, and
   (b) an electro-optical phase modulator.

10. The system of claim 9 wherein said modulator comprises an electro-optical phase modulator, said phase modulator having an optical input coupled to said first optical signal, an optical output coupled to said coupler, and an electrical control input connected to said baseband signal.

11. The system of claim 1 wherein said modulator modulates said combined output signal after an output of said coupler, said modulator comprising:
   an electro-optical amplitude modulator.

12. The system of claim 11 wherein said electro-optical phase modulator comprises an optical input coupled to said first optical signal, an optical output coupled to said coupler, and an electrical control input connected to said baseband signal.

13. The system of claim 11 wherein said electro-optical phase modulator comprises an optical input coupled to said first optical signal, an optical output coupled to said coupler, and an electrical control input connected to said baseband signal.

14. The system of claim 1 wherein said first optical signal and said second optical signal are single-frequency signals.

15. The system of claim 14 wherein said external modulator is one of an electro-optical amplitude modulator and an electro-optical phase modulator.

16. The system of claim 1, wherein both of said first optical signal and said second optical signal are unmodulated by a baseband signal before said coupler combines said first and second optical signals to produce said combined output signal.

17. A receiving system comprising:
(A) a dual optical signal generator producing a first optical signal and a second optical signal respectively, wherein said first optical signal is offset in frequency from said second optical signal by a difference frequency, and a coupler for combining said first and second optical signals to produce a combined output signal;
(B) a remote antenna station comprising,
   (1) an antenna for receiving a carrier signal containing modulation comprising a baseband signal,
   (2) an external modulator for modulating, in accordance with a baseband signal, said combined output signal;
(C) a first optical fiber having one end coupled to said combined output signal; and
(D) a receiver station comprising,
   (1) a photodetector coupled to another end of said optical fiber for receiving said combined output signal and converting said combined output signal to an electrical signal.

18. The system of claim 17 wherein said modulator modulates said first optical signal before an input of said first optical signal to said coupler, said modulator comprising one of:
(a) an electro-optical intensity modulator, and
(b) an electro-optical phase modulator.

19. The system of claim 18 wherein said dual optical signal generator and said coupler is located at said remote antenna station.

20. The system of claim 18 wherein said dual optical signal generator is located at said receiver station and said coupler is located at said remote antenna station, said system further comprising:
a second optical fiber for carrying said first optical signal from said dual optical signal generator at said receiver station to said modulator at said remote antenna station; and
a third optical fiber for carrying said second optical signal from said dual optical signal generator at said receiver station to said coupler at said remote antenna station.

21. The system of claim 18 wherein said modulator comprises an electro-optical phase modulator.

22. The system of claim 17 wherein said modulator modulates said combined output signal after an output of said coupler, said modulator comprising:
an electro-optical amplitude modulator.

23. The system of claim 22 wherein said dual optical signal generator and said coupler are located at said remote antenna station.

24. The system of claim 22 wherein said dual optical signal generator and said coupler are located at said receiver station, said system further comprising:
a second optical fiber for carrying said combined output signal from said coupler at said receiver station to said modulator at said remote antenna station.

25. The system of claim 17 wherein said modulator has a control input receiving said carrier signal with modulation, said control input of said baseband signal having a bandwidth corresponding to that of said carrier signal.

26. The system of claim 25 wherein said photodetector has a bandwidth corresponding to said baseband signal.

27. The system of claim 26 wherein said difference frequency is one of:

(a) a microwave frequency;
(b) a millimeter-wave frequency; and
(c) a radio frequency.

28. The system of claim 17 wherein said dual optical signal generator comprises first and second lasers each with co-linear polarization states for producing said first optical signal and said second optical signal, respectively.

29. The system of claim 28 wherein said transmitter station further comprises:
a reference signal source having a frequency harmonically related to a desired output frequency;
a reference laser having plural optical modes actively mode-locked to said reference signal source and having respective optical mode frequencies, whereby said reference laser is an actively mode-locked laser;
wherein each of said first and second lasers is tuned to a respective one of said optical mode frequencies, whereby said first and second lasers are injection locked to corresponding ones of said plural optical modes of said mode-locked laser;
wherein said difference frequency corresponds to a difference between two of said optical mode frequencies.

30. The system of claim 29 wherein said plural optical modes of said mode-locked laser span a frequency band at least hundreds of GigaHertz wide, and wherein said difference frequency is in a band encompassing millimeter and submillimeter wavelengths.

31. The system of claim 17 wherein said optical fiber is single-mode optical fiber having low dispersion and yielding a relatively high bandwidth-length.

32. The system of claim 17 wherein said modulator is an external modulator for modulating only said combined output signal.

33. The system of claim 17 wherein both of said first optical signal and said second optical signal are unmodulated by a baseband signal before said coupler combines said first and second optical signals to produce said combined output signal.

34. A transmission system comprising:
(A) a transmitter station comprising,
   (1) a dual optical signal generator producing a first optical signal and a second optical signal respectively, wherein said first optical signal is offset in frequency from said second optical signal by a difference frequency,
   (2) a coupler for receiving said first and second optical signals and combining said first and second optical signals to produce a combined output signal, wherein both of said first optical signal and said second optical signal are unmodulated by a baseband signal before said coupler combines said first and second optical signals;
   (3) an external modulator for modulating, in accordance with a baseband signal, said combined output signal;
(B) an optical fiber having one end coupled to said combined output signal; and
(C) a remote antenna station comprising,
   (1) a photodetector coupled to another end of said optical fiber for converting said combined output signal to an electrical signal, and
   (2) an antenna coupled to said electrical signal.

35. The system of claim 33 wherein said external modulator is an electro-optical phase modulator.

* * * * *